United States Patent
Cromer et al.

(10) Patent No.: US 7,370,227 B2
(45) Date of Patent: May 6, 2008

(54) DESKTOP COMPUTER BLADE FAULT IDENTIFICATION SYSTEM AND METHOD

(75) Inventors: Daryl C. Cromer, Apex, NC (US); Howard J. Locker, Cary, NC (US); Randall S. Springfield, Chapel Hill, NC (US); Rod D. Waltermann, Durham, NC (US)

(73) Assignee: International Business Machines Corporation, Armonk, NY (US)

( * ) Notice: Subject to any disclaimer, the term of this patent is extended or adjusted under 35 U.S.C. 154(b) by 554 days.

(21) Appl. No.: 11/044,433

(22) Filed: Jan. 27, 2005

(65) Prior Publication Data

US 2006/0168486 A1   Jul. 27, 2006

(51) Int. Cl.
*G06F 11/00* (2006.01)
(52) U.S. Cl. .................. 714/5; 714/4; 714/23; 714/25; 714/43; 709/212
(58) Field of Classification Search .................. 714/4, 714/23, 25, 43, 523; 709/212–216
See application file for complete search history.

(56) References Cited

U.S. PATENT DOCUMENTS

| | | | |
|---|---|---|---|
| 4,377,000 | A | 3/1983 | Staab |
| 4,823,256 | A | 4/1989 | Bishop et al. |
| 5,086,499 | A | 2/1992 | Mutone |
| 6,618,821 | B1 | 9/2003 | Duncan et al. |
| 6,728,807 | B1 | 4/2004 | Laursen |
| 6,748,559 | B1 | 6/2004 | Pfister et al. |
| 2003/0105859 | A1 | 6/2003 | Garnett et al. |
| 2004/0015581 | A1 | 1/2004 | Forbes |
| 2004/0054780 | A1 | 3/2004 | Romero |
| 2004/0103180 | A1 | 5/2004 | Brown et al. |
| 2004/0109406 | A1 | 6/2004 | Rothman et al. |

(Continued)

FOREIGN PATENT DOCUMENTS

EP   1489498   12/2004

(Continued)

OTHER PUBLICATIONS

Rist, Oliver and Chee, Brian; *Tools for the Desktop PC Revolution*; Info World, No. 41, Oct. 20, 2003.

*Primary Examiner*—Robert Beausoliel
*Assistant Examiner*—Charles Ehne
(74) *Attorney, Agent, or Firm*—Martin McKinley, Esq.; Steven M. Greenberg, Esq.; Carey Rodriguez Greenberg & Paul LLP (57) ABSTRACT

A method and system for remotely isolating faults in computer network devices coupled to a computer network. A plurality of first computer units are coupled to the computer network. The plurality of first computer units are located on a user side of the computer network. A plurality of second computer units are coupled to the computer network. The plurality of second computer units are located on a service provider side of the network. One of the plurality of second computer units is designated to provide computing services to one of the plurality of first computer units. One of the plurality of first computer units experiencing a fault communicating with its designated second computer unit uses another of the plurality of first computer units as a proxy computer unit to remotely isolate the fault.

9 Claims, 4 Drawing Sheets

U.S. PATENT DOCUMENTS

2004/0158627 A1    8/2004  Thornton
2004/0210887 A1*  10/2004  Bergen et al. .............. 717/168
2004/0262409 A1   12/2004  Crippen et al.
2005/0138473 A1*   6/2005  Mathew et al. ............... 714/27
2006/0164421 A1*   7/2006  Cromer et al. .............. 345/473

FOREIGN PATENT DOCUMENTS

JP        2005327233 A  * 11/2005

* cited by examiner

DESKTOP COMPUTER BLADE FAULT IDENTIFICATION SYSTEM AND METHOD

BACKGROUND OF THE INVENTION

1. Statement of the Technical Field

The present invention relates to desktop blade computer systems and more particularly to a desktop computer blade system and method for identifying and isolating faults that occur within the system.

2. Description of the Related Art

The increasing popularity of consolidating hardware and server application location through server blade technology has led to the development of desktop blade systems. Unlike the consolidation of servers into server blade systems, desktop blade systems by design separate the user and the "desktop" processing unit. For example, a typical desktop blade system includes one or more racks in a computer room or area each having one or more "blades" installed therein, i.e. a "bladecenter". Each blade in the bladecenter is a processing unit which is allocated to a user and provides the same functionality as if the processing unit were located on the user's desk. The user is provided with a small deskside device at the user's desk which provides interfaces for a display unit and interface devices such as a keyboard, mouse and USB ports. The deskside device is typically hardwired to the bladecenter or coupled to the bladecenter using a known networking technology such as Ethernet.

Using Ethernet and the Internet Protocol ("IP") as an example, video and keyboard/mouse information travel across the IP network via routers/switches from the deskside unit to the desktop processor in the bladecenter. The separation of these devices over distance and via the IP network adds a number of points of failure that do not exist in traditional desktop computer installations where the desktop processor is located at the user location and is directly connected to the peripheral devices. More particularly, in a desktop blade environment, points of failure include the network, the deskside unit and the desktop processor blade (and/or the bladecenter). As a result, the user can't readily assist with the identification of the nature of the problem and has no way to communicate with the bladecenter if there is a problem.

As a result of the above-described shortcomings, current desktop blade system implementations require time consuming and expensive visits to the deskside to identify and correct the problem. Also, during this time, the user can not use their computer, thereby impacting productivity. It is therefore desirable to have a desktop blade system and method which can allows the system itself to identify the source of faults problems and take autonomic corrective action. In the case where autonomic corrective action can not be taken, such as may occur when a non-redundant hardware, e.g., the deskside unit, failure requires a visit by a technician, it is desirable to have a system and method which isolates the fault.

SUMMARY OF THE INVENTION

The present invention addresses the deficiencies of the art in respect to authentication and provides a novel and non-obvious desktop blade system and method, for identifying faults and taking autonomic corrective action. In this regard, the system makes use of the UDP protocol and the existence of other deskside units to attempt to have a deskside unit experiencing a problem communicate with other deskside units to have those units assist with the identification and resolution of the problem.

According to one aspect, the present invention provides a system for remotely isolating faults in computer network devices coupled to a computer network. A plurality of first computer units are coupled to the computer network. The plurality of first computer units are located on a user side of the computer network. A plurality of second computer units are coupled to the computer network. The plurality of second computer units are located on a service provider side of the network. One of the plurality of second computer units is designated to provide computing services to one of the plurality of first computer units. One of the plurality of first computer units experiencing a fault communicating with its designated second computer unit uses another of the plurality of first computer units as a proxy computer unit to remotely isolate the fault.

According to another aspect, the present invention provides a method for remotely isolating faults in computer network devices coupled to a computer network. The computer network devices include a plurality of first computer units coupled to the computer network in which the plurality of first computer units are located on a user side of the computer network, a plurality of second computer units coupled to the computer network in which the plurality of second computer units are located on a service provider side of the network and one of the plurality of second computer units is designated to provide computing services to one of the plurality of first computer units. One of the plurality of first computer units is determined to be experiencing a fault communicating with its designated second computer unit. Another of the plurality of first computer units is used as a proxy computer unit to remotely isolate the fault.

According to still another aspect, a machine readable storage device having stored thereon a computer program for remotely isolating faults in computer network devices coupled to a computer network is provided. The computer network devices include a plurality of first computer units coupled to the computer network in which the plurality of first computer units are located on a user side of the computer network, a plurality of second computer units coupled to the computer network in which the plurality of second computer units are located on a service provider side of the network and one of the plurality of second computer units is designated to provide computing services to one of the plurality of first computer units. The computer program includes a set of instructions which when executed by a machine causes the machine to perform a method in which one of the plurality of first computer units is determined to be experiencing a fault communicating with its designated second computer unit. Another of the plurality of first computer units is used as a proxy computer unit to remotely isolate the fault.

Additional aspects of the invention will be set forth in part in the description which follows, and in part will be obvious from the description, or may be learned by practice of the invention. The aspects of the invention will be realized and attained by means of the elements and combinations particularly pointed out in the appended claims. It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate embodiments of the invention and together with the description, serve to explain the principles of the invention. The embodiments illustrated herein are presently preferred, it being understood, however, that the invention is not limited to the precise arrangements and instrumentalities shown, wherein.

DETAILED DESCRIPTION OF THE PREFERRED EMBODIMENTS

The present invention advantageously provides a method and system for fault isolation and notification for desktop blade system in a manner which minimizes the need for the desktop blade user to participate in the problem determination process despite the multiple points of failure existent in a desktop blade system. The present invention therefore provides a method and system allows a user, via a deskside device that can not connect to a desktop blade to automatically notify the bladecenter to take autonomic corrective action. If an autonomic fix is not possible, the present invention provides the ability to isolate the fault, thereby facilitating problem resolution.

Figure 1:
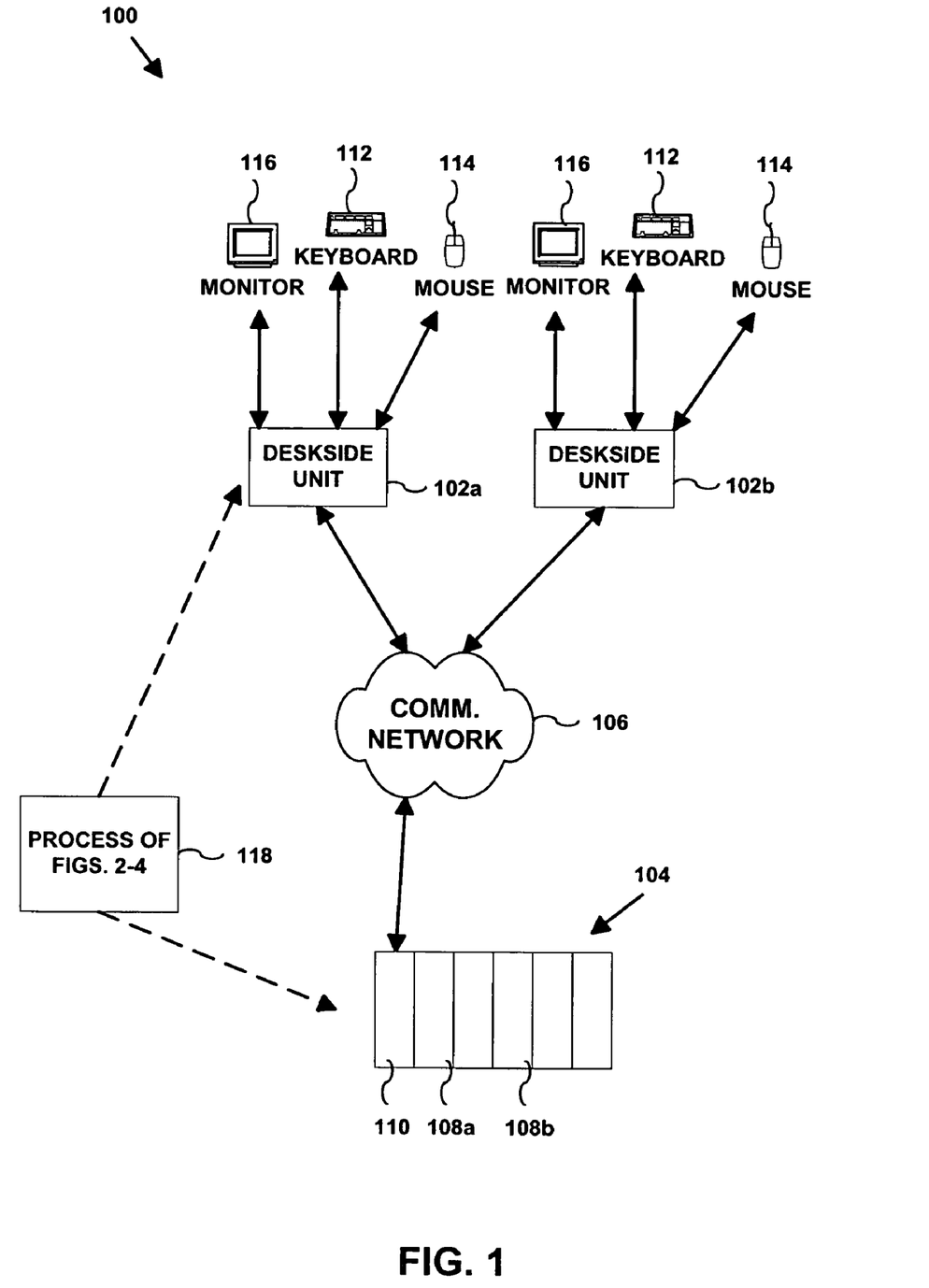
FIG. 1 is a diagram of an exemplary system constructed in accordance with the principles of the present invention.

Referring now to the drawing figures in which like reference designators refer to like elements there is shown in FIG. 1 a system constructed in accordance with the principles of the present invention and designated generally as "100". System 100 includes deskside units 102a and 102b (collectively referred to herein as deskside unit 102) in electronic communication with bladecenter 104 via communication network 106.

Bladecenter 104 includes one or more desktop blades 108 (two of which are shown in FIG. 1 as desktop blade 108a and 108b), and a bladecenter controller 110. Bladecenter 104 is typically located on the service provider side of communication network 106 in a service provider facility where multiple bladecenters 104 can be co-located and efficiently managed and maintained. Bladecenter controller 110 includes the hardware necessary to allow bladecenter 104 to communicate with other devices, to control bladecenter functions such as the allocation of individual desktop blades 108 to users, i.e., the allocation of desktop blades 108 to deskside units 102 and to perform other functions described herein. Bladecenter controller 110 can include a central processing unit, input/output interfaces, volatile and non-volatile memory, network interfaces and any other hardware as may be known in the art to control the operation of bladecenter 104. Accordingly, a computing network is formed by the devices shown in FIG. 1. For example, computing network devices are those devices coupled to communication network 106, such as bladecenter 104 and/or its constituent parts and desktop units 102.

Desktop blade hardware is generally known in the art and typically includes those hardware elements required to allow desktop blades 108 to function as a desktop personal computer, to communicate with and accept control commands from bladecenter controller 110 and to perform the inventive functions described herein. For example, desktop blades 108 include a central processing unit, operating system, volatile and/or non-volatile memory and interface hardware and software needed to allow desktop blade 108 to communicate with bladecenter controller 110 and deskside units 102. Of note, although FIG. 1 shows a single connection to communication network 106 from bladecenter controller 110, the invention is not so limited. It is contemplated that direct connections between one or more desktop blades 108 and communication network 106 can be made. Desktop blades 108 communicate with bladecenter controller 110 using a communication backplane within the bladecenter 104 chassis or using any other technique as may be known in the art.

Communication network 106 can be any network capable of transporting information from a deskside unit 102 to a bladecenter 104. Examples of communication network 106 include Internet Protocol (IP) networks such the Internet, a telephone network and an electric company power distribution network. However, for the sake of simplicity, communication network 106 is referred to herein in the context of an IP network.

Deskside unit 102 can be any deskside device capable of performing the functions described herein and is located on the user side of communication network 106 at or near the user's physical work space. For example, deskside unit 102 includes hardware for communicating with communication network 106 as well as appropriate software to do the same. Deskside unit 102 also includes components such as non-volatile and volatile storage devices and interface hardware and software to support peripheral devices such as a keyboard 112, mouse 114 and monitor 116. In operation, deskside unit 102 allows a user to view display screens on monitor 116 that were assembled by a desktop blade 108. Techniques for performing this function are known. Similarly, techniques for providing data to desktop blade 108 based on a user's manipulation of keyboard 112 and mouse 114 are known.

As described below in detail, deskside unit 102 preferably includes communication software that allows deskside unit 102 to also communicate with other deskside units 102. For example, the user datagram protocol (UDP) portion of the IP protocol stack can be used for such communication. It is presumed that one of skill in the art can implement the functions described herein with respect to deskside unit 102 to deskside unit 102 communication using a protocol like UDP.

In addition, although the example below is described with respect to UDP, it is contemplated that other broadcast and non-broadcast methods of communicating with and locating other deskside units 102 can be used. For example, deskside units 102 can be configured with a predefined list of addresses, such as IP addresses, for other deskside units 102 can may be available to assist with fault isolation and resolution. A deskside unit 102 experiencing a problem could try to communicate with other deskside units 102 in its subnet. There are also other registration class broadcast methods that can be used such as the CISCO Group Multicast Protocol ("CGMP"), Generic Attribute Registration Protocol ("GARP") and GARP Multicast Registration Protocol ("GMRP"). A router registration class could be defined for a system that would allow a deskside unit 102 to send an IP packet to the router that would then be sent to every registered deskside unit 102.

Fault identification and autonomic process 118 is performed by deskside units 102 and bladecenter 104. This process is described below in detail with reference to FIGS. 2-4.

Figure 2:
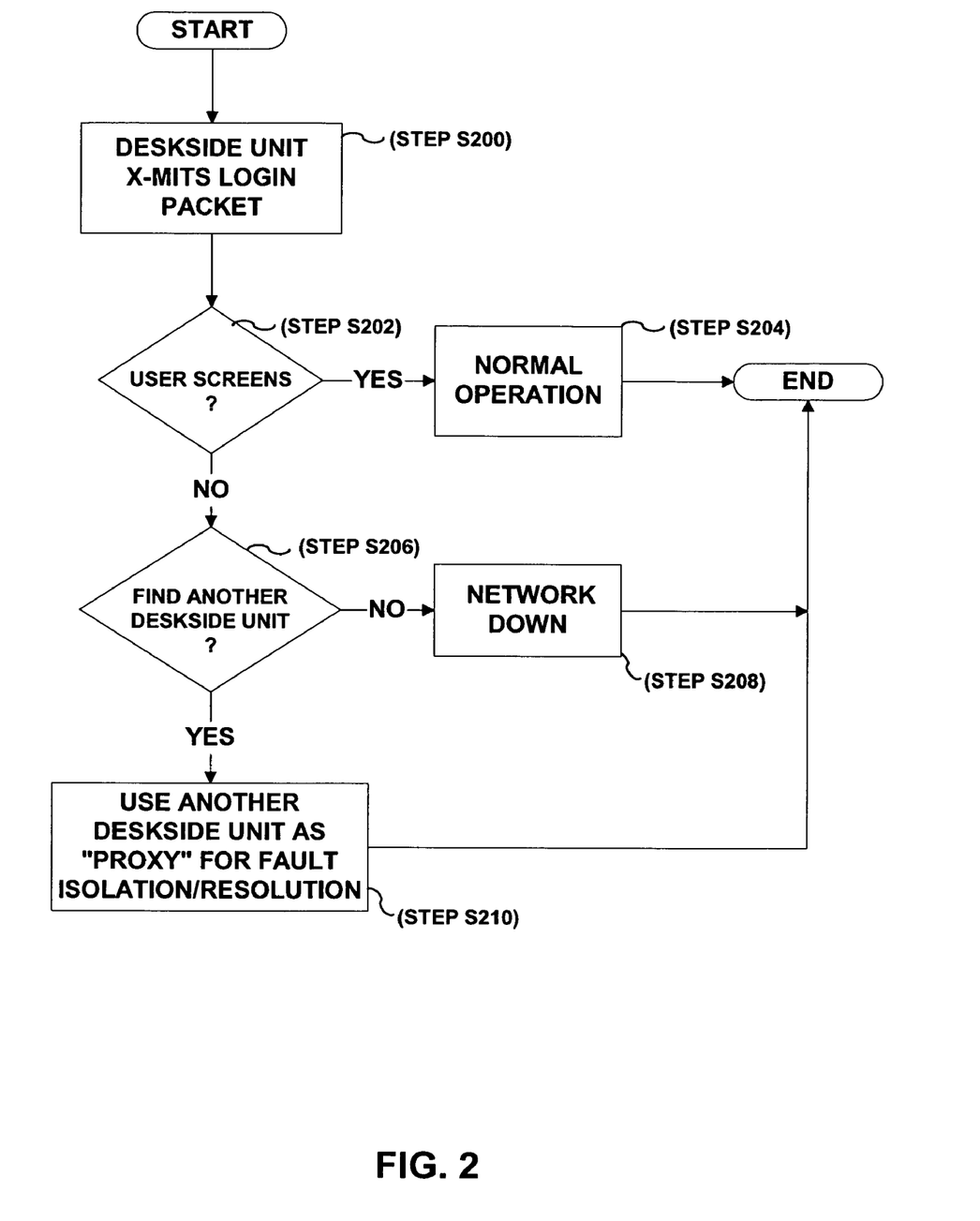
FIG. 2 is a flow chart of the overall process of the present invention.

The overall process of the present invention is described with reference to FIG. 2. Initially, deskside unit 102 tests for proper network configuration (not shown). Such tests are known in the art and may include tests to determine whether IP, gateway and Domain Name System ("DNS") server addresses were acquired, such as via the Dynamic Host Configuration Protocol ("DHCP"), that the deskside unit 102 can find the gateway, DNS servers, etc. The user is alerted if this basic startup testing fails. Assuming the basic network configuration is proper, when the user wishes to log on, deskside unit 102 detects this request and transmits a packet to bladecenter 104 to initiate the login (Step S200). The login request is a request to get assigned a desktop blade 108, obtain authorization for access, etc. Under normal operation, once authorized, user screens are sent to the deskside unit 102 for display on monitor 116. In accordance with the present invention, deskside unit 102 includes a timeout function so that if user screens are not returned, it is assumed something is wrong and fault isolation is commenced (Step S202). If user screens are returned, the desktop blade system 100 is presumed to be in normal operation (Step S204) and the process of the present invention ends. If user screens are not returned after a predetermined timeout period, fault isolation commences.

Initially, the problematic deskside unit 102 determines if another deskside unit 102 can be found (Step S206). Under one embodiment, the problematic deskside unit 102 can broadcast UDP packets in which the UDP packets have an identification field that can be reserved for the function of locating another deskside unit 102. It is contemplated that all deskside units 102 constructed in accordance with the principles of the present invention can include software within the IP stack that will answer such a UDP broadcast request. Within the UDP packet is the IP address of the broadcasting deskside unit 102. For the sake of simplicity and ease of discussion, the problematic deskside unit 102, i.e., the deskside unit 102 that is having trouble receiving the user screens from bladecenter 104 will be referred to herein as deskside unit 102a. The other deskside unit 102, i.e., the deskside unit 102 that is acting as the "proxy" to assist with problem isolations/resolution will be referred to herein as deskside unit 102b.

If deskside unit 102a cannot find another deskside unit, i.e., cannot find deskside unit 102b within a predetermined timeout period, it is presumed that the network is down (Step S208). The user is notified of this problem and instructed to contact the information technology department for further assistance. Of course, if no user screens are returned and deskside unit 102a cannot locate another deskside unit 102, it is also possible that deskside unit 102a has had a major failure in which case the user would presumably also notify the information technology department of the same.

If another deskside unit 102 can be located, this other device is used as a "proxy" for fault isolation and problem resolution (Step S210). As noted above, deskside 102b serves this purpose as described herein.

Figure 3:
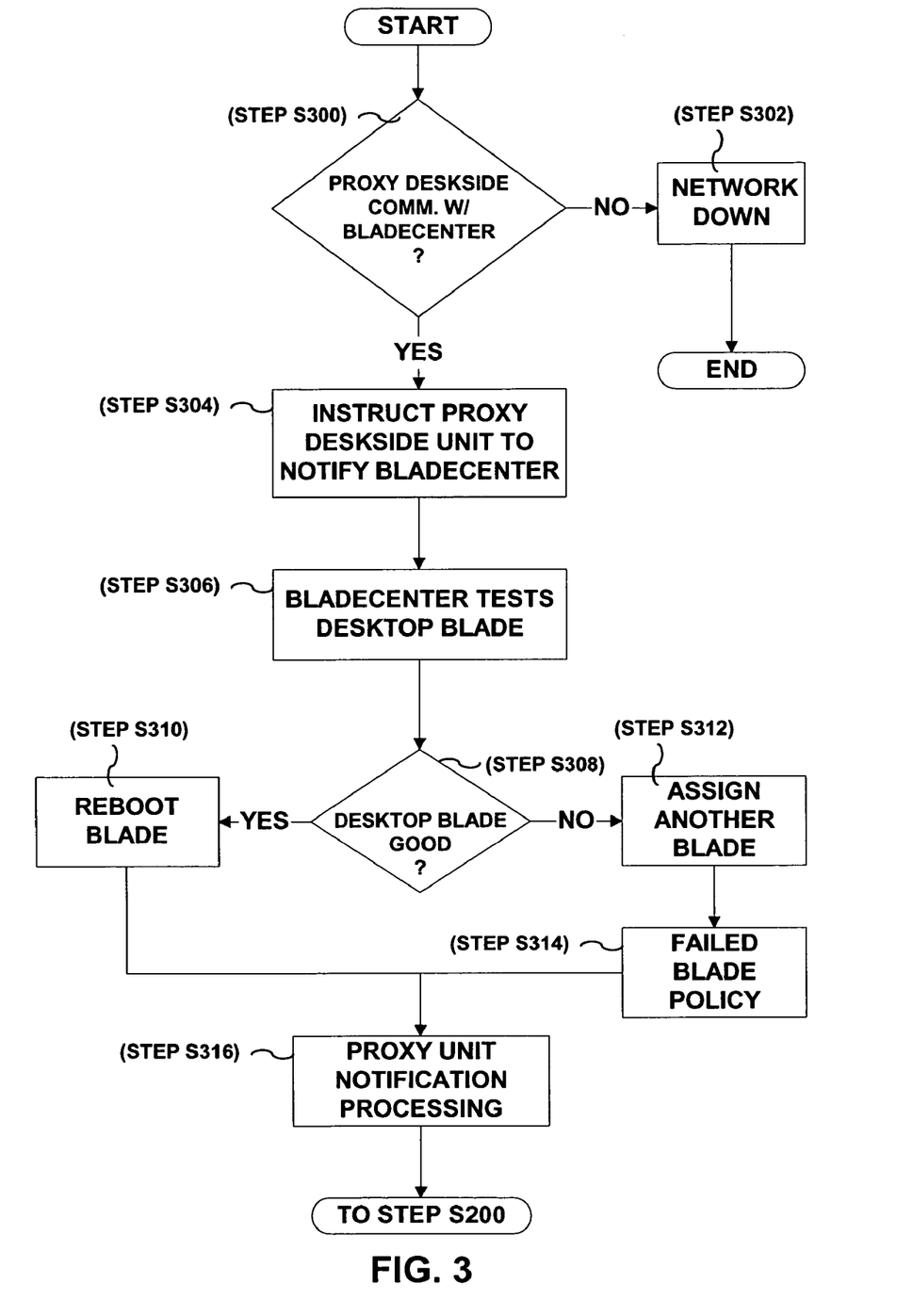
FIG. 3 is a flow chart of the client content request preparation and transmission process (Step S210) of FIG. 2.

The step of using another deskside unit 102 as a proxy for fault isolation and problem resolution (Step S210) is explained in detail with reference to FIG. 3. If another deskside unit 102, such as deskside unit 102b is located, deskside unit 102a transmits a request to proxy deskside unit 102b inquiring as to whether deskside unit 102b can communicate with bladecenter 104 (Step S300). If proxy deskside unit 102b cannot communicate with bladecenter 104, proxy deskside unit 102b notifies deskside unit 102a that deskside unit 102b cannot communicate with bladecenter 104 and that communication network 106 must be down at some point between deskside units 102 and bladecenter 104 (Step S302). In addition, it is also contemplated that, upon receiving indication from proxy deskside unit 102b that it cannot communicate with bladecenter 104, deskside unit 102a can make the determination that communication network 106 is down. In either case, the user is notified of the network outage. A message can be generated and transmitted to the information technology department alerting of the network outage and the user can be instructed to contact the information technology group (because it is possible that the network outage may render the information technology group unreachable through communication network 106).

If the proxy deskside unit 102b can communicate with bladecenter 104, deskside unit 102a instructs proxy deskside unit 102b to notify bladecenter 104 that deskside unit 102a cannot connect (Step S304). Bladecenter 104, via bladecenter controller 110, tests deskside blade 108 assigned to deskside unit 102a (Step S306). If the desktop bladecenter 108 is good (Step S308), bladecenter controller 110 reboots blade 108 (Step S310). If the desktop blade 108 is not good, bladecenter controller 110 assigns another desktop blade 108 (Step S312), and the failed blade action policy is implemented (Step S314).

For example, a failed blade action policy may include notifying a particular information technology professional that blade has failed, automatically powering down the failed desktop blade 108, performing automated diagnostics on failed desktop blade 108 and/or creating log entries, etc.

Regardless of whether the desktop blade 108 is good and was rebooted (Step S310) or failed and a new blade assigned, proxy deskside unit 102b is used to facilitate notification processing to further assist with isolation and resolution (Step S316) and the process returns to step S200 (see FIG. 2) so that the user can try to log onto the desktop blade 108 again.

Figure 4:
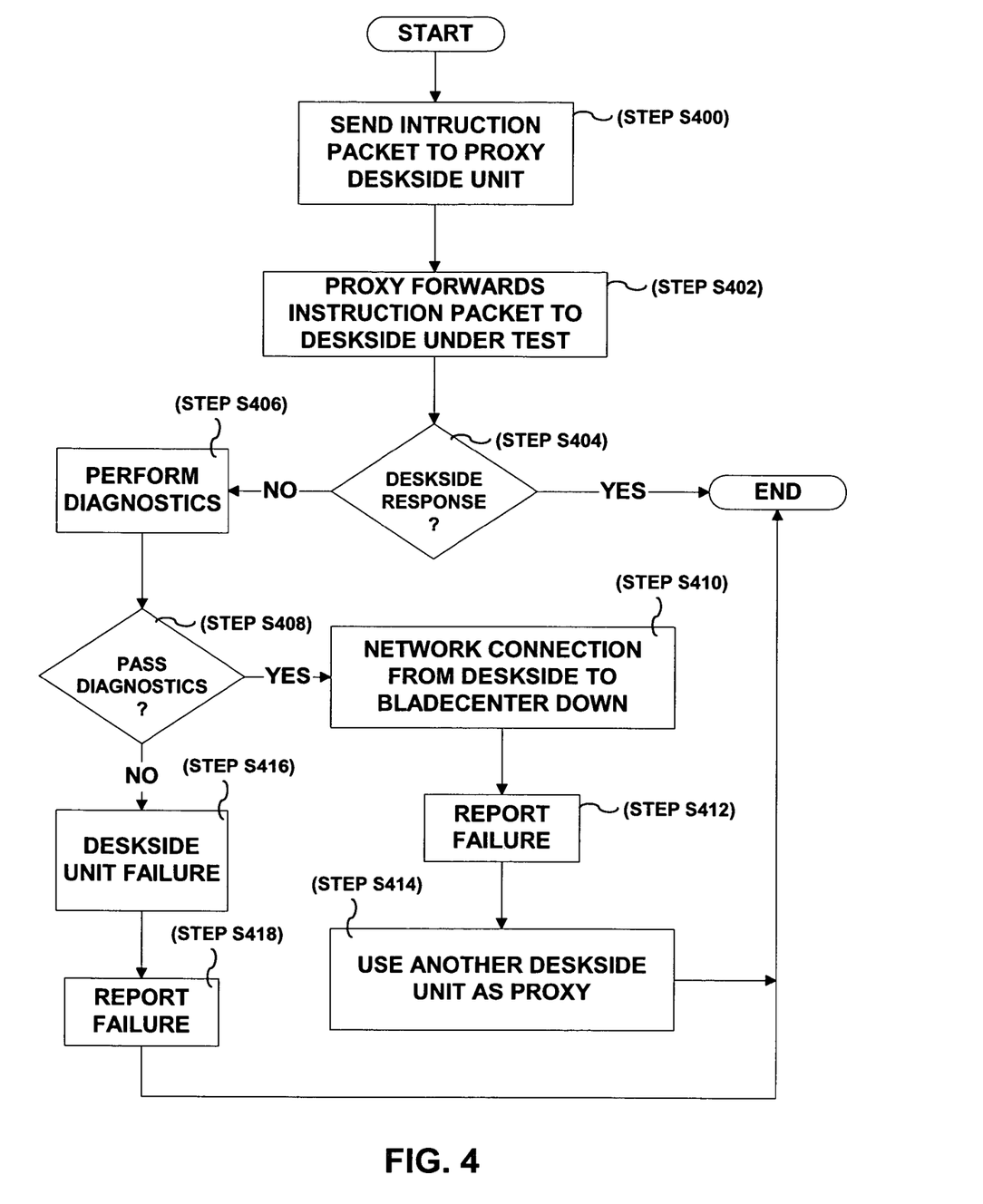
FIG. 4 is a flow chart of the process of notifying the proxy deskside device and using the proxy deskside device to further isolate the fault (Step S316) of FIG. 3.

Step S316 is described in detail with reference to FIG. 4. Bladecenter 104, via bladecenter controller 110, sends an instruction packet to proxy deskside unit 102b indicating the action that was taken (Step S400), e.g., that the desktop blade 108 assigned to desktop unit 102a has been rebooted or that the new desktop blade 108 has been assigned to deskside unit 102a. Proxy deskside unit 102b forwards the instruction packet to the deskside unit under test, i.e., deskside unit 102a (Step S402). Deskside unit 102b waits for a predetermined time for deskside unit 102a to respond to acknowledge receipt of the instruction (Step S404). If an acknowledgment was received, it is assumed that deskside unit 102a is operational and the process ends. In this case, either the problem has been resolved by the assignment of a new desktop blade 108 or there is a problem with communication network 106 and the information technology department has been notified or the user is instructed to notify the information technology department.

If acknowledgment is not received from deskside unit 102a, proxy deskside unit 102b performs diagnostic testing on deskside unit 102a in an attempt to further isolate the fault (Step S406). Actual diagnostic tests like memory tests, software operation, network communication interface tests, and the like are known and are beyond the scope of the present invention. If deskside unit 102a passes the diagnostic testing, it is known that deskside unit 102a is operational and that, because the original blade 102a assigned to deskside unit 102a is operational or has been substituted with another desktop unit 108, the network connection from deskside unit 102a to bladecenter 104 is down (Step S410).

Proxy deskside unit 102b reports the communication network failure to the information technology department (Step S412) and alerts deskside unit 102a that another deskside unit 102 should be used as a proxy to communicate with desktop blade 108 (Step S414). In this case, although communications with bladecenter 104 may be slower due to the additional routing that packets between deskside unit 102a and desktop blade 108 will take, communications will at least enable the user to perform work. Of note, if, in accordance with Step S414, a deskside unit 102 is needed by deskside unit 102a for communication with desktop blade 108, any other deskside unit 102 can be used. Put another way, the proxy deskside unit is not limited to the deskside unit 102b that initially responded to the request from deskside unit 102a for assistance, described above with respect to Steps S206 and S210. In determining which deskside unit 102 will assist deskside unit 102a as a communication proxy for actual work (as opposed to fault isolation), algorithms such as using the deskside unit with the lowest processor load, fastest communication response time, etc., can be used.

If deskside unit 102a does not pass the diagnostic testing (Step S408) it is determined that deskside unit 102a has failed (Step S416). Proxy deskside unit 102b reports the failure (Step S418) to the information technology department. In addition, if deskside unit 102a is partially operational, proxy deskside unit 102b can alert deskside unit 102a of the failure so that the user can also be notified of the failure and that the information technology department has been alerted.

It is contemplated that notifying the information technology group in any fashion described above can result in the automatic generation of a trouble ticket. Depending on the failure, information relating to the trouble ticket can be provided to the user so that the user has confidence that the problem has been identified and that the information technology group has been notified and will attend to the problem.

Although the present invention has been described within the context of a computer using deskside units 102 and bladecenters 104, the invention is not limited to such. It is contemplated that the present invention can be implemented in any environment which uses units proximate a user, i.e., on a user side of a network, coupled to or in communication with a bank of centrally located processing devices. For example, the present invention can be implemented in a cable television network for isolation determining problems between set-top cable boxes and/or cable modems and cable company controllers located at a cable company facility. The present invention can also be implemented in a telephone system for determining problems between a telephone, DSL modem, etc. located at a user facility and telephone company controlled equipment located at a telephone company facility.

The present invention can be realized in hardware, software, or a combination of hardware and software. An implementation of the method and system of the present invention can be realized in a centralized fashion in one computer system, or in a distributed fashion where different elements are spread across several interconnected computer systems. Any kind of computer system, or other apparatus adapted for carrying out the methods described herein, is suited to perform the functions described herein.

A typical combination of hardware and software could be a general purpose computer system with a computer program that, when being loaded and executed, controls the computer system such that it carries out the methods described herein. The present invention can also be embedded in a computer program product, which comprises all the features enabling the implementation of the methods described herein, and which, when loaded in a computer system is able to carry out these methods.

Computer program or application in the present context means any expression, in any language, code or notation, of a set of instructions intended to cause a system having an information processing capability to perform a particular function either directly or after either or both of the following a) conversion to another language, code or notation; b) reproduction in a different material form. Significantly, this invention can be embodied in other specific forms without departing from the spirit or essential attributes thereof, and accordingly, reference should be had to the following claims, rather than to the foregoing specification, as indicating the scope of the invention.

We claim:

1. Method for remotely isolating faults in computer network devices coupled to a computer network, the computer network devices including a plurality of first computer units coupled to the computer network, the plurality of first computer units located on a user side of the computer network and a plurality of second computer units coupled to the computer network, the plurality of second computer units located on a service provider side of the network, a one of the plurality of second computer units being designated to provide computing services to one of the plurality of first computer units, the method comprising:

determining that a one of the plurality of first computer units is experiencing a fault communicating with its designated second computer unit; and using another of the plurality of first computer units as a proxy computer unit to remotely isolate the fault, wherein the plurality of first computer units are deskside units in a desktop blade system and the plurality of second computer units are desktop blades included as part of a bladecenter, and wherein using another of the plurality of first computer units as a proxy computer unit to remotely isolate the fault comprises:

instructing the bladecenter to diagnostically test the desktop blade assigned to the deskside unit experiencing the fault, rebooting the desktop blade assigned to the deskside unit experiencing the fault if the desktop blade assigned to the deskside unit experiencing the fault passes the diagnostic tests; and assigning another desktop blade to the deskside unit experiencing the fault if the desktop blade assigned to the deskside unit experiencing the fault fails the diagnostic tests.

2. The method according to claim 1, wherein using another of the plurality of first computer units as a proxy computer unit to remotely isolate the fault further comprises instructing the proxy deskside unit to transmit a packet to the deskside unit experiencing the fault, the packet including data indicating whether the originally assigned desktop blade has been rebooted or whether another desktop blade has been assigned.

3. The method according to claim 2, wherein using another of the plurality of first computer units as a proxy computer unit to remotely isolate the fault further comprises, if the proxy deskside unit does not receive a response from the deskside unit experiencing the fault acknowledging that the data packet was received, performing diagnostic testing on the deskside unit experiencing the fault to further isolate the fault.

4. The method according to claim 3, wherein, if the deskside unit experiencing the fault passes the diagnostic testing, using another of the plurality of first computer units as a proxy computer unit to remotely isolate the fault further comprises:
determining that the communication network has failed at a point between the deskside unit experiencing the fault and the bladecenter;
reporting the failure; and
having the deskside unit experiencing the fault use another deskside unit to communicate with the desktop blade assigned to deskside unit experiencing the fault; and
wherein, if the deskside unit experiencing the fault fails the diagnostic testing, using another of the plurality of first computer units as a proxy computer unit to remotely isolate the fault further comprises:
determining that the deskside experiencing the fault has a failure; and
reporting the failure.

5. The method according to claim 1, wherein the deskside unit experiencing the fault communicating with its designated desktop blade uses one of a UDP protocol and a registration class broadcast protocol to communicate with the proxy deskside unit to instruct the bladecenter to diagnostically test the desktop blade assigned to the deskside unit experiencing the fault.

6. A machine readable storage device having stored thereon a computer program for remotely isolating faults in computer network devices coupled to a computer network, the computer network devices including a plurality of first computer units coupled to the computer network, the plurality of first computer units located on a user side of the computer network and a plurality of second computer units coupled to the computer network, the plurality of second computer units located on a service provider side of the network, a one of the plurality of second computer units being designated to provide computing services to one of the plurality of first computer units, the computer program comprising a set of instructions which when executed by a machine causes the machine to perform a method including:
determining that a one of the plurality of first computer units is experiencing a fault communicating with its designated second computer unit; and
using another of the plurality of first computer units as a proxy computer unit to remotely isolate the fault, wherein
the plurality of first computer units are deskside units in a desktop blade system and the plurality of second computer units are desktop blades included as part of a bladecenter, and wherein
using another of the plurality of first computer units as a proxy computer unit to remotely isolate the fault comprises:
instructing the bladecenter to diagnostically test the desktop blade assigned to the deskside unit experiencing the fault, rebooting the desktop blade assigned to the deskside unit experiencing the fault if the desktop blade assigned to the deskside unit experiencing the fault passes the diagnostic tests; and
assigning another desktop blade to the deskside unit experiencing the fault if the desktop blade assigned to the deskside unit experiencing the fault fails the diagnostic tests.

7. The method according to claim 6, wherein using another of the plurality of first computer units as a proxy computer unit to remotely isolate the fault further comprises instructing the proxy deskside unit to transmit a packet to the deskside unit experiencing the fault, the packet including data indicating whether the originally assigned desktop blade has been rebooted or whether another desktop blade has been assigned.

8. The method according to claim 7, wherein using another of the plurality of first computer units as a proxy computer unit to remotely isolate the fault further comprises, if the proxy deskside unit does not receive a response from the deskside unit experiencing the fault acknowledging that the data packet was received, performing diagnostic testing on the deskside unit experiencing the fault to further isolate the fault.

9. The method according to claim 8, wherein, if the deskside unit experiencing the fault passes the diagnostic testing, using another of the plurality of first computer units as a proxy computer unit to remotely isolate the fault further comprises:
determining that the communication network has failed at a point between the deskside unit experiencing the fault and the bladecenter;
reporting the failure; and
having the deskside unit experiencing the fault use another deskside unit to communicate with the desktop blade assigned to deskside unit experiencing the fault; and
wherein, if the deskside unit experiencing the fault fails the diagnostic testing, using another of the plurality of first computer units as a proxy computer unit to remotely isolate the fault further comprises:
determining that the deskside experiencing the fault has a failure; and
reporting the failure.

* * * * *